(12) United States Patent
Han et al.

(10) Patent No.: US 11,955,448 B2
(45) Date of Patent: Apr. 9, 2024

(54) ARCHITECTURE TO MANAGE FLI BUMP HEIGHT DELTA AND RELIABILITY NEEDS FOR MIXED EMIB PITCHES

(71) Applicant: Intel Corporation, Santa Clara, CA (US)

(72) Inventors: Jung Kyu Han, Chandler, AZ (US); Hongxia Feng, Chandler, AZ (US); Xiaoying Guo, Chandler, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 810 days.

(21) Appl. No.: 16/880,483

(22) Filed: May 21, 2020

(65) Prior Publication Data

US 2021/0366860 A1 Nov. 25, 2021

(51) Int. Cl.
*H01L 23/00* (2006.01)
*H01L 23/538* (2006.01)

(52) U.S. Cl.
CPC .......... *H01L 24/14* (2013.01); *H01L 23/5381* (2013.01); *H01L 24/16* (2013.01); *H01L 2224/1403* (2013.01); *H01L 2224/16227* (2013.01); *H01L 2924/381* (2013.01)

(58) Field of Classification Search
CPC ........... H01L 23/5381; H01L 23/49816; H01L 24/14; H01L 24/16; H01L 2224/1403; H01L 2224/16227; H01L 2224/16225; H01L 2924/381; H01L 23/5385; H01L 23/4984; H01L 23/49894

USPC .......................................................... 257/737
See application file for complete search history.

(56) References Cited

U.S. PATENT DOCUMENTS

| | | | |
|---|---|---|---|
| 10,163,798 B1* | 12/2018 | Alur | H01L 24/16 |
| 10,431,537 B1 | 10/2019 | Pietambaram et al. | |
| 10,833,052 B2* | 11/2020 | Shih | H01L 25/0655 |
| 2015/0102482 A1* | 4/2015 | Liu | H01L 25/0655 257/737 |
| 2019/0206792 A1* | 7/2019 | Collins | H01L 23/49838 |
| 2019/0221478 A1* | 7/2019 | Shusterman | H01L 23/53252 |
| 2019/0333861 A1* | 10/2019 | Pietambaram | H01L 21/4857 |
| 2019/0341351 A1* | 11/2019 | May | H01L 24/25 |
| 2019/0371778 A1* | 12/2019 | Sankman | H01L 23/3135 |
| 2019/0393145 A1 | 12/2019 | Pietambaram et al. | |
| 2020/0035604 A1* | 1/2020 | Rubin | H01L 24/16 |
| 2020/0135679 A1 | 4/2020 | Darmawaikarta et al. | |

* cited by examiner

*Primary Examiner* — Khiem D Nguyen
(74) *Attorney, Agent, or Firm* — Schwabe, Williamson & Wyatt, P.C.

(57) ABSTRACT

Embodiments disclosed herein include electronic packages. In an embodiment, an electronic package comprises a package substrate and a bridge substrate embedded in the package substrate. In an embodiment, first pads are over the package substrate, where the first pads have a first pitch, and second pads are over the bridge substrate, where the second pads have a second pitch that is smaller than the first pitch. In an embodiment, a barrier layer is over individual ones of the second pads. In an embodiment, reflown solder is over individual ones of the first pads and over individual ones of the second pads. In an embodiment, a first standoff height of the reflown solder over the first pads is equal to a second standoff height of the reflown solder over the second pads.

25 Claims, 12 Drawing Sheets

ARCHITECTURE TO MANAGE FLI BUMP HEIGHT DELTA AND RELIABILITY NEEDS FOR MIXED EMIB PITCHES

TECHNICAL FIELD

Embodiments of the present disclosure relate to semiconductor devices, and more particularly to packaging architectures to accommodate mixed EMIB pitches.

BACKGROUND

Current trends are towards the integration of more than one die within an electronic package. For example, bridges that are embedded within a package substrate may be used to electrically couple together two or more dies in order to provide enhanced functionality for the electronic package. Multi-chip integration, however, leads to many assembly issues. One such assembly issue is first level interconnect (FLI) bump height variation. Bump height variation is particularly problematic when pads with non-uniform pitches are provided on the package substrate. Variation in the bump heights across an electronic package leads to problems with attachment (e.g., using thermal compression bonding (TCB)).

Additionally, FLIs with different functionalities (e.g., core bumps and bridge bumps) may have different power requirements. The difference in current that passes through the interconnect may require different barrier layer stack-ups in order to provide the needed reliability.

EMBODIMENTS OF THE PRESENT DISCLOSURE

Described herein are packaging architectures to accommodate mixed EMIB pitches, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
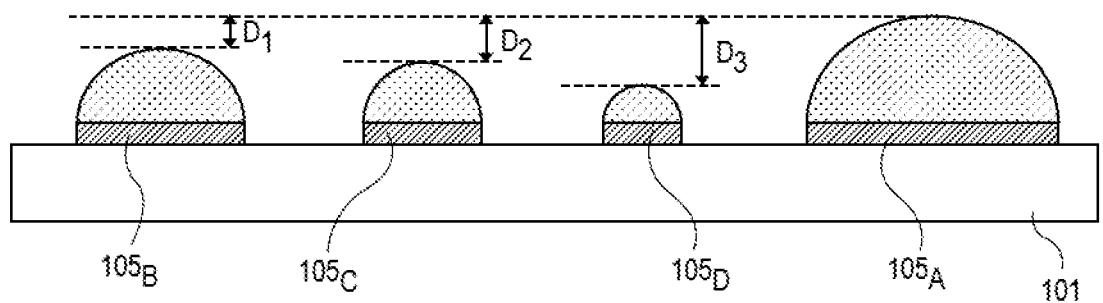
FIG. 1 is a cross-sectional illustration of pads with non-uniform pitch that illustrates the issue with reflown solder having a non-uniform standoff height.

As noted above, non-uniform pitches on an electronic package may yield non-uniform first level interconnect (FLI) standoff heights. An example of such a situation is shown in FIG. 1. As shown, four pads $105_{A-D}$ are provided over the package substrate 101. The different pads $105_{A-D}$ represent four different pitches that may occur on a single package substrate 101. As shown, the largest bump pitch over pad $105_A$ has the largest bump standoff height, and the smallest bump pitch over pad $105_D$ has the smallest bump standoff height. The bump height variations are depicted by the deltas $D_{1-3}$. Such variation provides reliability issues and makes thermal compression bonding (TCB) difficult, if not impossible.

Accordingly, embodiments disclosed herein include FLI architectures that include barrier layers over one or more of the pads in a mixed pitch architecture. The barrier layers are chosen to have a height that corrects for the delta in the bump standoff height. As such, there is minimal variation in the height of the FLI, and assembly is simplified. Additionally, processes for providing non-uniform barrier layer thicknesses also allow for variations in the composition of the barrier layer over different pads. The variation in the barrier layer composition allows for tailoring of the interconnect in order to provide improved reliability.

Figure 2A:
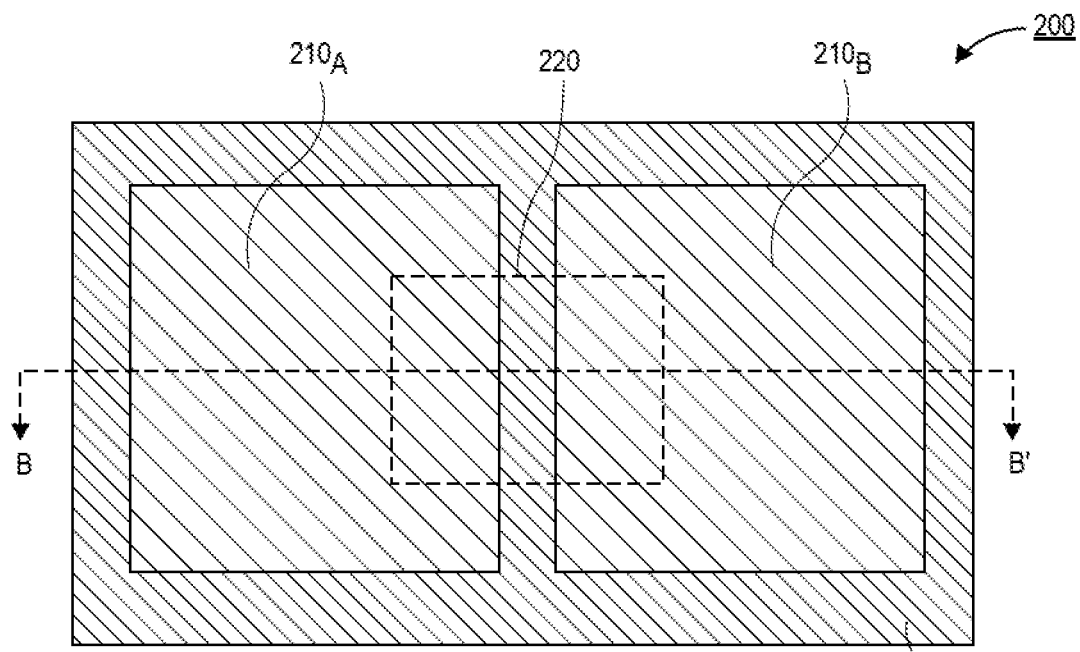
FIG. 2A is a plan view illustration of an electronic package with a pair of dies connected by an embedded bridge, in accordance with an embodiment.

Referring now to FIG. 2A, a plan view illustration of an electronic package 200 is shown, in accordance with an embodiment. The electronic package 200 may comprise a package substrate 201. The package substrate 201 may be any suitable electronic packaging material. For example, the package substrate 201 may comprise laminated dielectric layers with conductive routing (not shown) therein. In some embodiments, the package substrate 201 is cored. In other embodiments, the package substrate 201 is coreless.

In an embodiment a plurality of dies 210 are disposed over the package substrate 201. In the particular embodiment illustrated in FIG. 2A, a first die $210_A$ and a second die $210_B$ are provided. The dies 210 may be any type of die. In a particular embodiment, the dies $210_A$ and $210_B$ are processor dies. In an embodiment, the first die $210_A$ is electrically coupled to the second die $210_B$ by an embedded bridge 220. The embedded bridge 220 is shown with dashed lines to indicate that it is embedded within the package substrate 201.

In an embodiment, the first die $210_A$ and the second die $210_B$ may have non-uniformly pitched interconnects (not shown in FIG. 2A). For example, first interconnects may have a first pitch, and second interconnects may have a second, smaller, pitch. The first interconnects may be located between the dies 210 and the package substrate 201, and the second interconnects may be located between the dies 210 and the embedded bridge 220.

Figure 2B:
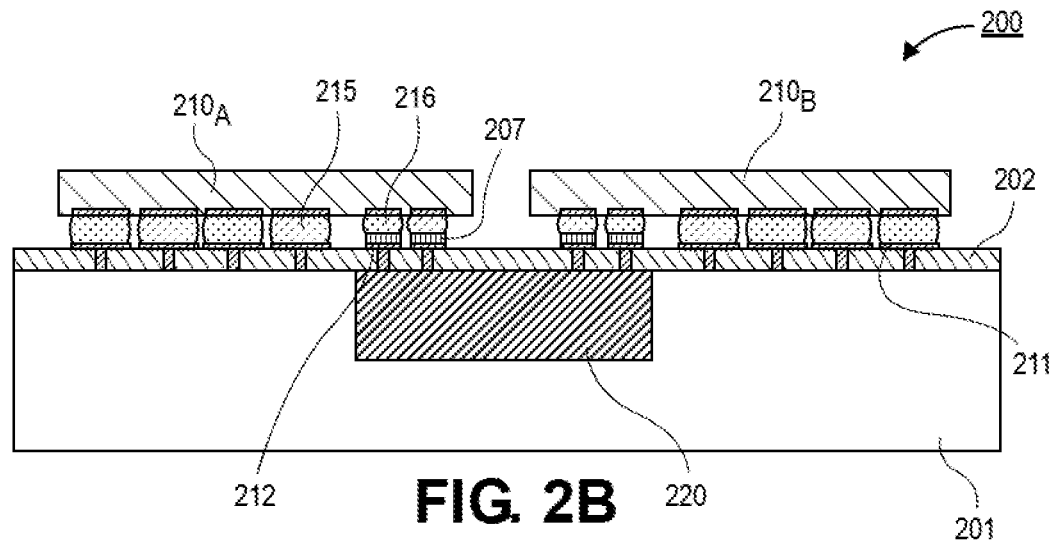
FIG. 2B is a cross-sectional illustration of the electronic package in FIG. 2A that illustrates pads with a non-uniform pitch, in accordance with an embodiment.
Figure 2C:
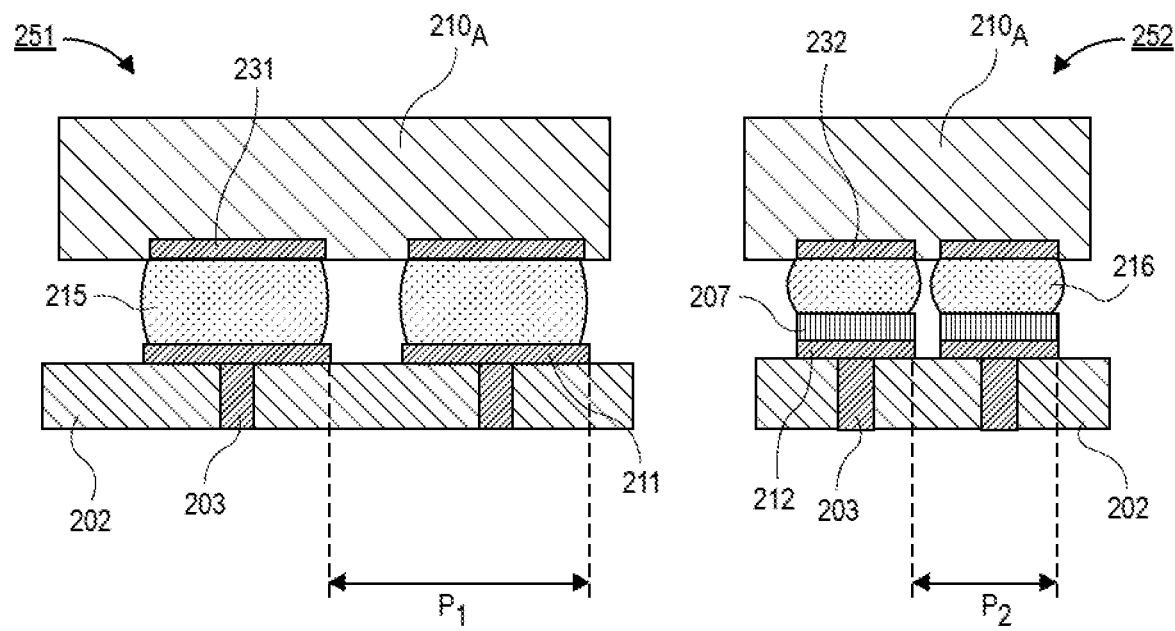
FIG. 2C is a zoomed in illustration of a first interconnect with a first pitch and a second interconnect with a second pitch, in accordance with an embodiment.

Referring now to FIG. 2B, a cross-sectional illustration of the electronic package 200 in FIG. 2A along line B-B' is shown, in accordance with an embodiment. FIG. 2C is a zoomed in cross-sectional illustration of first interconnects 251 and second interconnects 252, in order to more clearly illustrate features of various embodiments.

As shown in FIG. 2B, the first die $210_A$ and the second die $210_B$ are disposed over a package substrate 201. A bridge 220 is embedded in the package substrate 201. The bridge 220 may electrically couple the first die $210_A$ to the second die $210_B$. In an embodiment, first interconnects 251 (illustrated in greater detail in FIG. 2C) may be provided between the dies 210 and the package substrate 201, and second interconnects 252 (illustrated in greater detail in FIG. 2C) may be provided between the dies 210 and the bridge 220.

A solder resist layer 202 may be disposed over a top surface of the package substrate 201 and the bridge 220. Pillars 203 may be disposed through the solder resist layer 202. The pillars 203 provide an electrical connection between package side pads 211 and 212 and the package substrate 201 and bridge 220, respectively. In other embodiments, the pillars 203 may be omitted and the pads 211 and 212 may be on the package substrate 201 and bridge 220, respectively.

As shown, the first interconnects 251 may comprise a first package side pad 211, a solder interconnect 215 and a first die side pad 231. In an embodiment, the first package side pads 211 may have a first pitch $P_1$. In an embodiment, the second interconnects 252 may comprise a second package side pad 212, a barrier layer 207, a solder interconnect 216, and a second die side pad 232. The second package side pads 212 may have a second pitch $P_2$. In an embodiment, the second pitch $P_2$ is smaller than the first pitch $P_1$. In an embodiment, the first pitch $P_1$ may be approximately 60 μm or greater, and the second pitch $P_2$ may be approximately 60 μm or smaller. In a particular embodiment, the second pitch $P_2$ may be approximately 40 μm or smaller. As used herein, "approximately" may refer to a value that is within 10% (greater or smaller) than the stated value.

As noted above, the smaller pitch (and reduced pad size) of the second package side pad 212 results in a reflown solder 216 that has a smaller standoff height than the reflown solder 215 of the first interconnects 251. A thickness of the barrier layer 207 of the second interconnects 252 is chosen in order to accommodate the different standoff heights. In an embodiment, the barrier layer 207 may be any suitable barrier layer or stack of barrier layers. For example, the barrier layer 207 may comprise one or more of nickel, palladium, and gold.

Figure 3A:
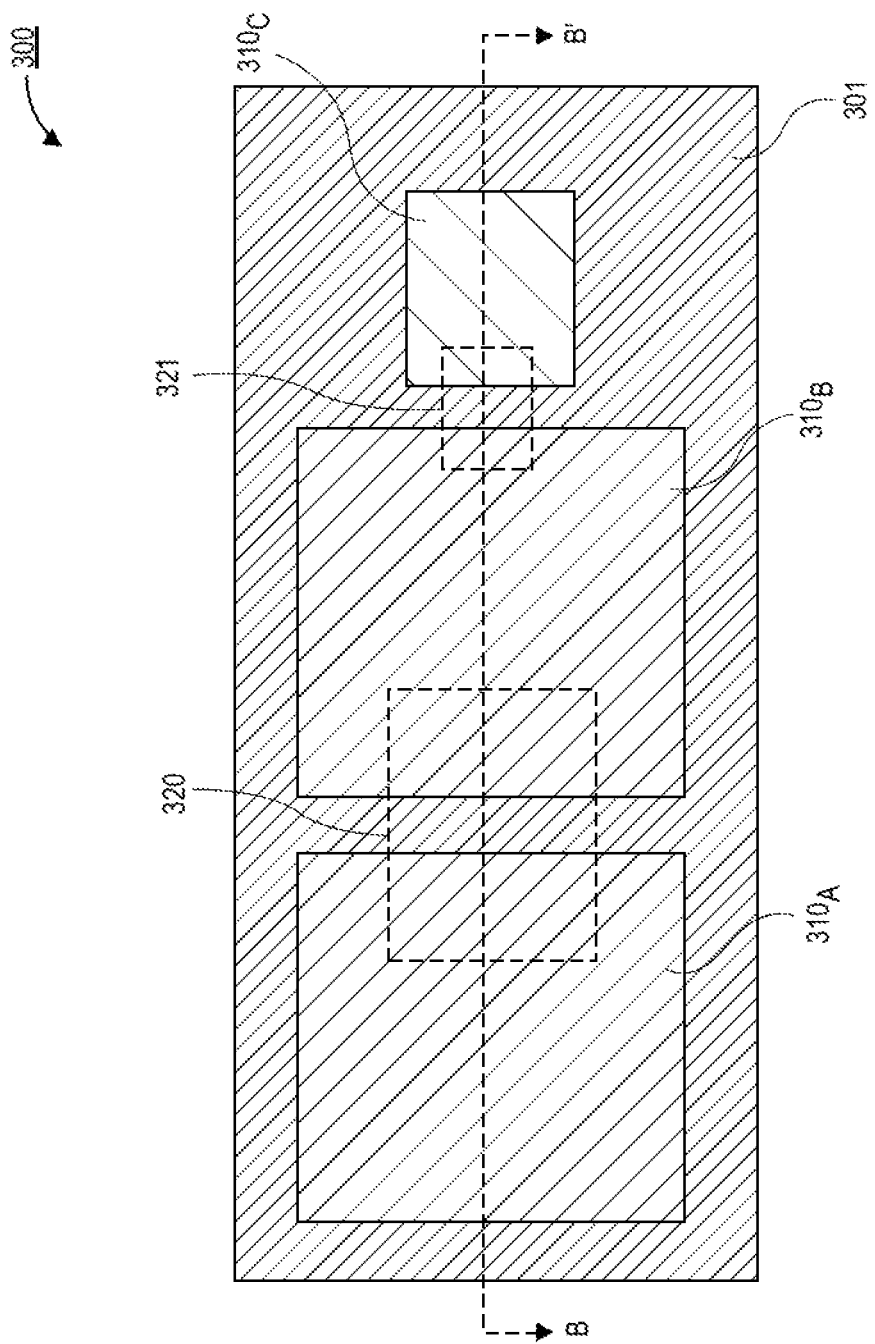
FIG. 3A is a plan view illustration of an electronic package with three dies connected by a pair of embedded bridges, in accordance with an embodiment.

Referring now to FIG. 3A, a plan view illustration of an electronic package 300 is shown, in accordance with an embodiment. The electronic package 300 may comprise a package substrate 301. The package substrate 301 may be substantially similar to the package substrate 201 described above. In an embodiment, a plurality of dies 310 are disposed over the package substrate 301. For example, a first die $310_A$, a second die $310_B$, and a third die $310_C$ are provided in FIG. 3A. In some embodiments, the first die $310_A$ and the second die $310_B$ are the same type of die 310. For example, the first die $310_A$ and the second die $310_B$ may be processor dies. In an embodiment, the third die $310_C$ may be a memory die or any other type of die.

In an embodiment, the first die $310_A$ may be electrically coupled to the second die $310_B$ by a first bridge 320. In an embodiment, the second die $310_B$ may be electrically coupled to the third die $310_C$ by a second bridge 321. The first bridge 320 and the second bridge 321 may be embedded in the package substrate 301 (as indicated by the dashed lines).

In an embodiment, the electronic package 300 may comprise a plurality of different interconnect pitches. The various interconnect pitches may be the result of using different technology nodes and/or from sourcing the dies 310 from different providers. For example, a first interconnect pitch may be provided between the dies 310 and the package substrate, a second interconnect pitch may be provided between the dies 310 and the first bridge 320, and a third interconnect pitch may be provided between the dies 310 and the second bridge 321.

Figure 3B:
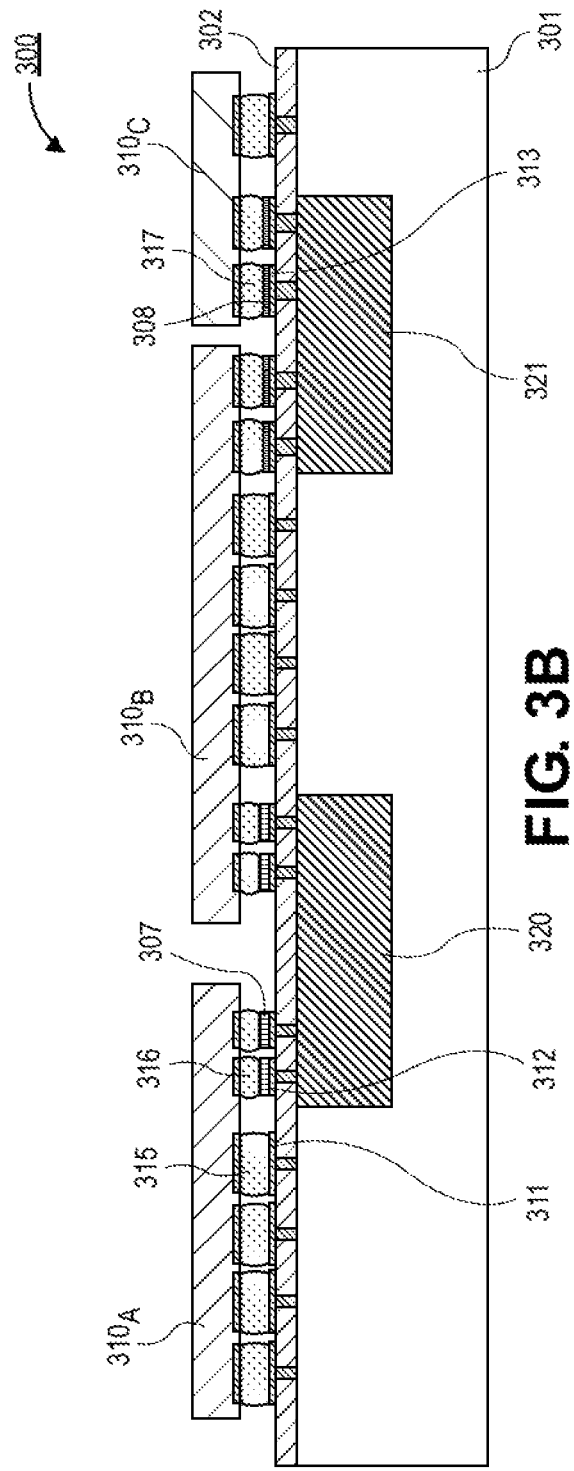
FIG. 3B is a cross-sectional illustration of the electronic package in FIG. 3A that illustrates pads with at least three different pitches, in accordance with an embodiment.
Figure 3C:
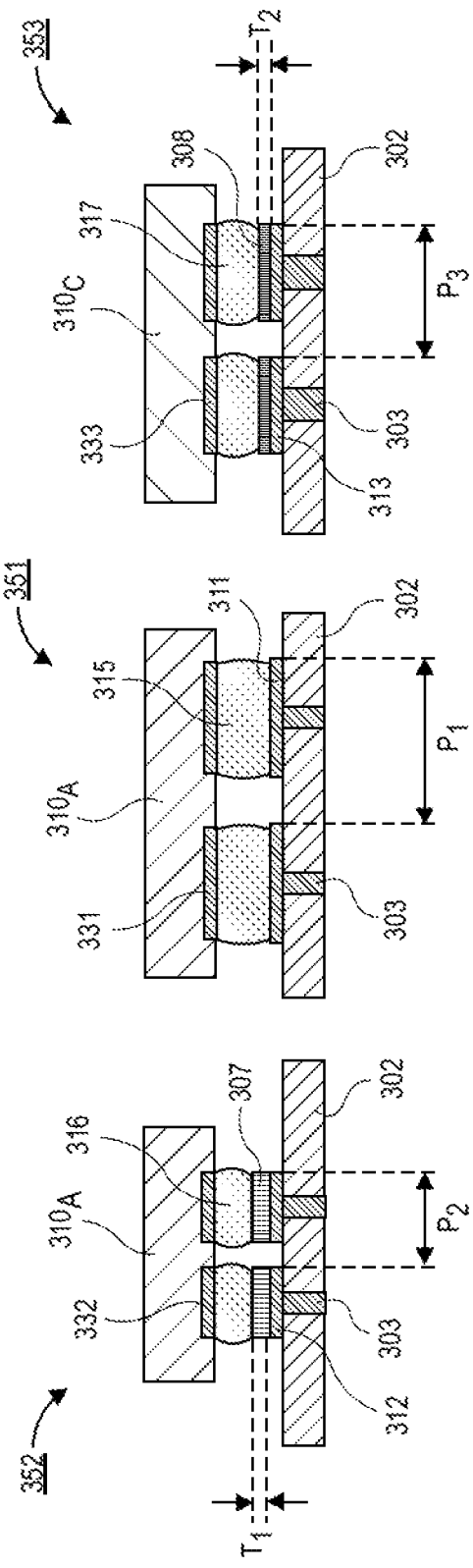
FIG. 3C is a zoomed in illustration of a first interconnect, a second interconnect, and a third interconnect, in accordance with an embodiment.

Referring now to FIG. 3B, a cross-sectional illustration of the electronic package 300 in FIG. 3A along line B-B' is shown, in accordance with an embodiment. FIG. 3C is a zoomed in cross-sectional illustration of first interconnects 351, second interconnects 352, and third interconnects 353 in order to more clearly illustrate features of various embodiments.

As shown in FIG. 3B, the first die $310_A$, the second die $310_B$, and the third die $310_C$ are disposed over a package substrate 301. A first bridge 320 and a second bridge 321 are embedded in the package substrate 301. The first bridge 320 may electrically couple the first die $310_A$ to the second die $310_B$, and the second bridge 321 may electrically couple the second die $310_B$ to the third die $310_C$. In an embodiment, first interconnects 351 (illustrated in greater detail in FIG. 3C) may be provided between the dies 310 and the package substrate 301, second interconnects 352 (illustrated in greater detail in FIG. 3C) may be provided between the dies 310 and the first bridge 320, and third interconnects 353 (illustrated in greater detail in FIG. 3C) may be provided between the dies 310 and the second bridge 321.

A solder resist layer 302 may be disposed over a top surface of the package substrate 301 and the bridges 320/321. Pillars 303 may be disposed through the solder resist layer 302. The pillars 303 provide an electrical connection between package side pads 311, 312, 313 and the package substrate 301 and bridges 320/321. In other embodiments, the pillars 303 may be omitted, similar to the embodiment described above.

As shown, the first interconnects 351 may comprise a first package side pad 311, a solder interconnect 315 and a first die side pad 331. In an embodiment, the first package side pads 311 may have a first pitch $P_1$. In an embodiment, the second interconnects 352 may comprise a second package side pad 312, a barrier layer 307, a solder interconnect 316, and a second die side pad 332. The second package side pads 312 may have a second pitch $P_2$. In an embodiment, the third interconnects 353 may comprise a third package side pad 313, a barrier layer 308, a solder interconnect 317, and a third die side pad 333. The third package side pads 313 may have a third pitch $P_3$. In an embodiment, the second pitch $P_2$ is smaller than the third pitch $P_3$, and the third pitch $P_3$ is smaller than the first pitch $P_1$. In an embodiment, the first pitch $P_1$ may be approximately 60 μm or greater, and the third pitch $P_3$ may be approximately 60 μm or smaller. In a particular embodiment, the first pitch is approximately 60 μm or greater, the second pitch $P_2$ may be approximately 40 μm or smaller, and the third pitch $P_3$ is between approximately 40 μm and approximately 60 μm.

As noted above, the smaller pitch (and reduced pad size) of the second package side pads 312 and the third package side pads 313 (relative to the first package side pads 311) results in a reflown solder 316/317 that has a smaller standoff height than the reflown solder 315 of the first interconnects 351. A thickness of the barrier layer 307 of the second interconnects 352 and a thickness of the barrier layer 308 of the third interconnects 353 are chosen in order to accommodate the different standoff heights. In an embodiment, the barrier layers 307 and 308 may be any suitable barrier layer or stack of barrier layers. For example, the barrier layers 307 and 308 may comprise one or more of nickel, palladium, and gold.

In an embodiment, the barrier layer 307 may have a first thickness $T_1$ and the barrier layer 308 may have a second thickness $T_2$. When the third pitch $P_3$ is greater than the second pitch $P_2$, the second thickness $T_2$ may be smaller than the first thickness $T_1$. In an embodiment, the barrier layer 307 and the barrier layer 308 may have the same material composition. In other embodiments, the barrier layer 307 may have a different material composition than the barrier layer 308.

Figure 4A:
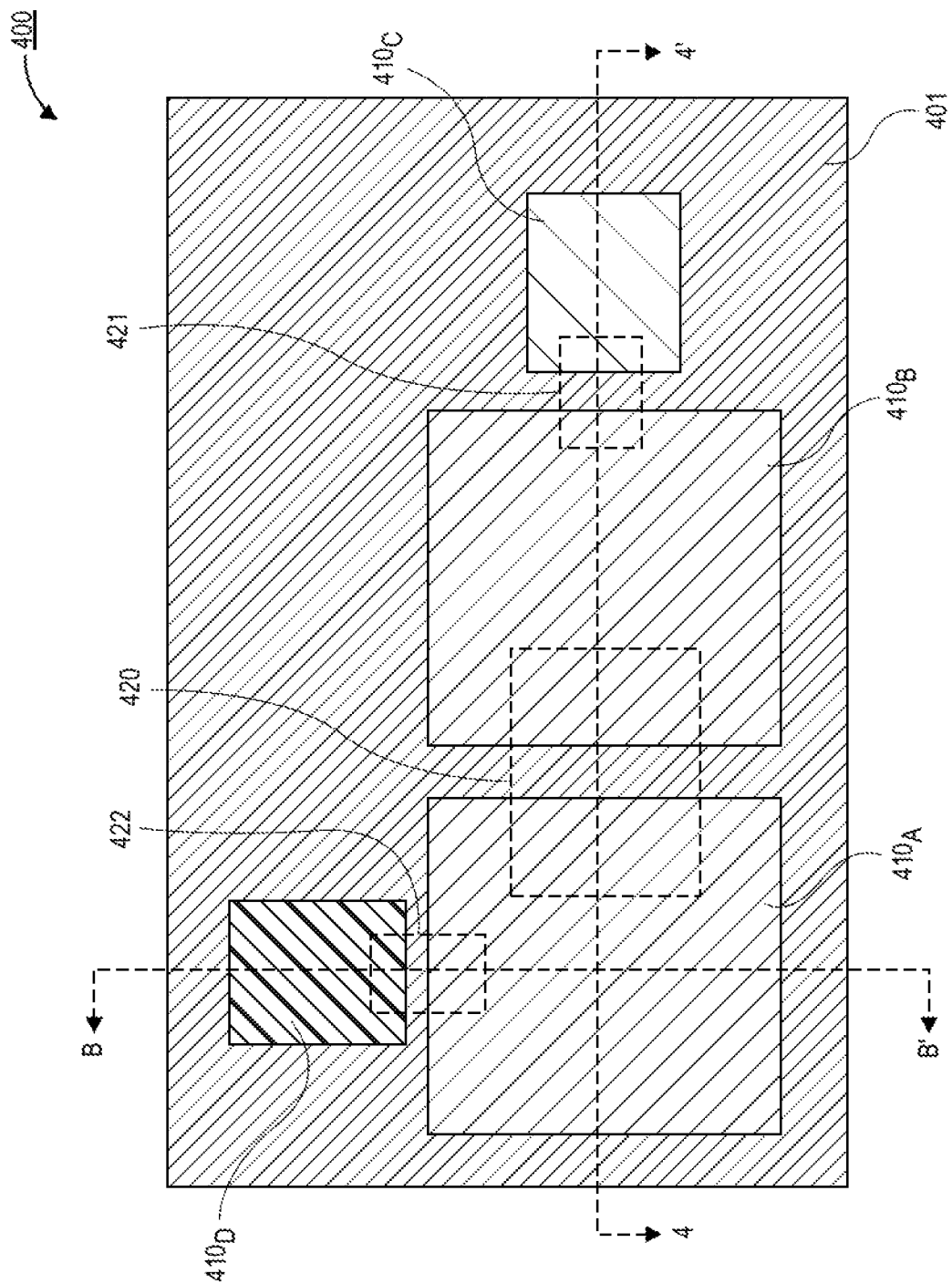
FIG. 4A is a plan view illustration of an electronic package with four dies connected by three embedded bridges, in accordance with an embodiment.

Referring now to FIG. 4A, a plan view illustration of an electronic package 400 is shown, in accordance with an embodiment. The electronic package 400 may comprise a package substrate 401. The package substrate 401 may be substantially similar to the package substrate 201 described above. In an embodiment, a plurality of dies 410 are disposed over the package substrate 401. For example, a first die $410_A$, a second die $410_B$, a third die $410_C$, and a fourth die $410_D$ are provided in FIG. 4A. In some embodiments, the first die $410_A$ and the second die $410_B$ are the same type of die 410. For example, the first die $410_A$ and the second die $410_B$ may be processor dies. In an embodiment, the third die $410_C$ and the fourth die $410_D$ may be memory dies or any other type of dies. The third die $410_C$ may be a different type of die than the fourth die $410_D$.

In an embodiment, the first die $410_A$ may be electrically coupled to the second die $410_B$ by a first bridge 420. In an embodiment, the second die $410_B$ may be electrically coupled to the third die $410_C$ by a second bridge 421. In an embodiment, the first die $410_A$ may be electrically coupled to the fourth die $410_D$ by a third bridge 422. The first bridge 420, the second bridge 421, and the third bridge 422 may be embedded in the package substrate 401 (as indicated by the dashed lines).

In an embodiment, the electronic package 400 may comprise a plurality of different interconnect pitches. The various interconnect pitches may be the result of using different technology nodes and/or from sourcing the dies 410 from different providers. For example, a first interconnect pitch may be provided between the dies 410 and the package substrate, a second interconnect pitch may be provided between the dies 410 and the first bridge 420, a third interconnect pitch may be provided between the dies 410 and the second bridge 421, and a fourth interconnect pitch may be provided between the dies 410 and the third bridge 422.

Figure 4B:
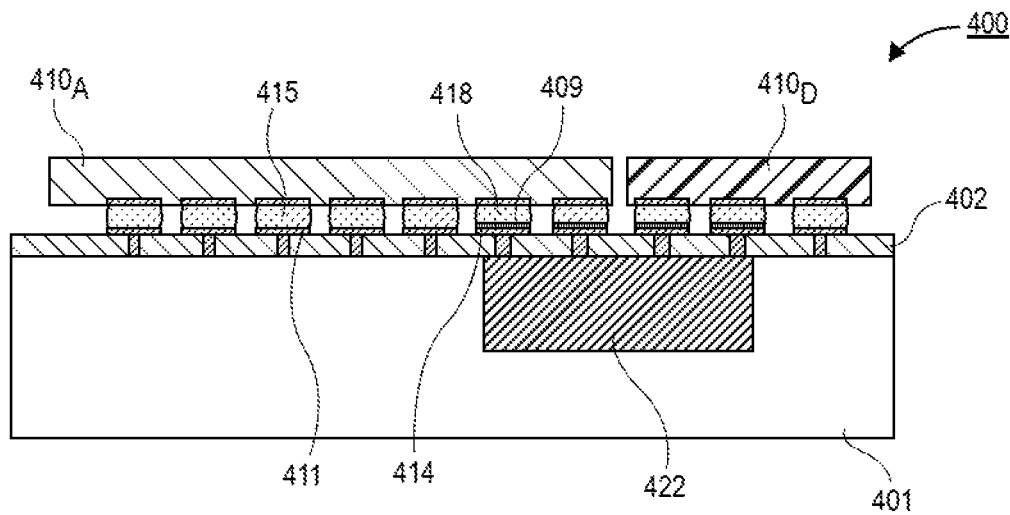
FIG. 4B is a cross-sectional illustration of the electronic package in FIG. 4A that illustrates pads with non-uniform pitches, in accordance with an embodiment.
Figure 4C:
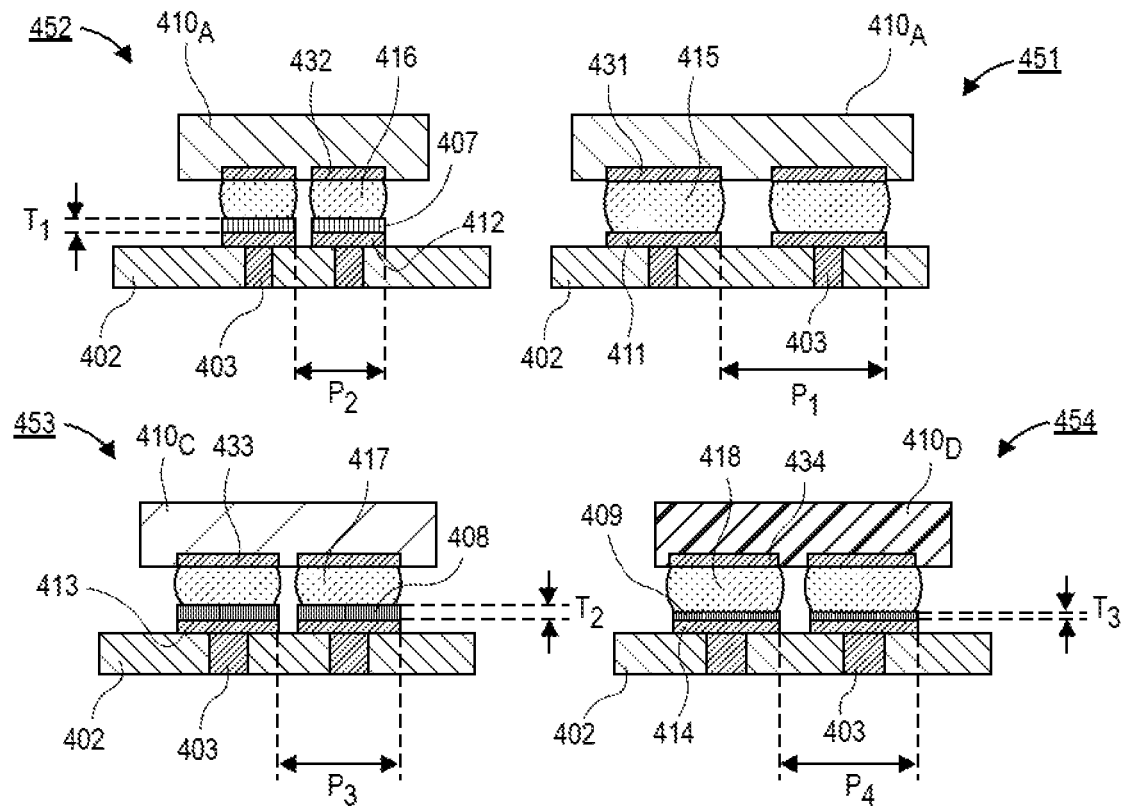
FIG. 4C is a zoomed in cross-sectional illustration of four different interconnects of the electronic package, in accordance with an embodiment.

Referring now to FIG. 4B, a cross-sectional illustration of the electronic package 400 in FIG. 4A along line B-B' is shown, in accordance with an embodiment. The cross-section of the electronic package 400 along line 4-4' may be substantially similar to the illustration in FIG. 3B, and therefore, will not be repeated here. FIG. 4C is a zoomed in cross-sectional illustration of first interconnects 451, second interconnects 452, third interconnects 453, and fourth interconnects 454 in order to more clearly illustrate features of various embodiments.

As shown in FIG. 4B, the first die $410_A$ and the fourth die $410_D$ are disposed over a package substrate 401. A third bridge 422 is embedded in the package substrate 401. The third bridge 422 may electrically couple the first die $410_A$ to the fourth die $410_D$. In an embodiment, first interconnects 451 (illustrated in greater detail in FIG. 4C) may be provided between the dies 410 and the package substrate 401 and fourth interconnects 454 (illustrated in greater detail in FIG. 4C) may be provided between the dies 410 and the third bridge 422. While not shown in the cross-section illustrated in FIG. 4B, second interconnects 452 (illustrated in FIG. 4C) may be provided between the dies 410 and the first bridge 420, and third interconnects 453 (illustrated in FIG. 4C) may be provided between the dies 410 and the second bridge 421.

A solder resist layer 402 may be disposed over a top surface of the package substrate 401 and the third bridge 422. Pillars 403 may be disposed through the solder resist layer 402. The pillars 403 provide an electrical connection between package side pads 411 and 414 and the package substrate 401 and third bridge 422. In other embodiments, the pillars 403 may be omitted, similar to the embodiment described above.

As shown in FIG. 4C, the first interconnects 451 may comprise a first package side pad 411, a solder interconnect 415 and a first die side pad 431. In an embodiment, the first package side pads 411 may have a first pitch $P_1$. In an embodiment, the second interconnects 452 may comprise a second package side pad 412, a barrier layer 407, a solder interconnect 416, and a second die side pad 432. The second package side pads 412 may have a second pitch $P_2$. In an embodiment, the third interconnects 453 may comprise a third package side pad 413, a barrier layer 408, a solder interconnect 417, and a third die side pad 433. The third package side pads 413 may have a third pitch $P_3$. In an embodiment, the fourth interconnects 454 may comprise a fourth package side pad 414, a barrier layer 409, a solder interconnect 418, and a fourth die side pad 434. The fourth package side pads 414 may have a fourth pitch $P_4$.

In an embodiment, the second pitch $P_2$ is smaller than the third pitch $P_3$, the third pitch $P_3$ is smaller than the fourth pitch $P_4$, and the fourth pitch $P_4$ is smaller than the first pitch $P_1$. In an embodiment, the first pitch $P_1$ may be approximately 60 μm or greater, the fourth pitch $P_4$ may be approximately 60 μm or smaller, the third pitch $P_3$ may be between approximately 40 μm and approximately 50 μm, and the second pitch $P_2$ may be approximately 40 μm or smaller. In a particular embodiment, the fourth pitch is approximately 55 μm, the third pitch is approximately 45 μm, and the second pitch is approximately 36 μm.

As noted above, the smaller pitch (and reduced pad size) of the second package side pads 412, the third package side pads 413, and the fourth package side pads 414 (relative to the first package side pads 411) results in a reflow solder 416/417/418 that has a smaller standoff height than the reflown solder 415 of the first interconnects 451. A thickness of the barrier layer 407 of the second interconnects 452, a thickness of the barrier layer 408 of the third interconnects 453, and a thickness of the barrier layer 409 are chosen in order to accommodate the different standoff heights. In an embodiment, the barrier layers 407/408/409 may be any suitable barrier layer or stack of barrier layers. For example, the barrier layers 407/408/409 may comprise one or more of nickel, palladium, and gold.

In an embodiment, the barrier layer 407 may have a first thickness $T_1$, the barrier layer 408 may have a second thickness $T_2$, and the barrier layer 409 may have a third thickness $T_3$. When the third pitch $P_3$ is greater than the second pitch $P_2$, the second thickness $T_2$ may be smaller than the first thickness $T_1$. Similarly, when the fourth pitch $P_4$ is greater than the third pitch $P_3$, the third thickness $T_3$ may be smaller than the second thickness $T_2$. In an embodiment, two or more of the barrier layers 407/408/409 may have the same material composition. In other embodiments, two or more of the barrier layers 407/408/409 may have a different material compositions.

Referring now to FIGS. 5A-5L, a series of cross-sectional illustrations depicting a process for fabricating an electronic package 560 with non-uniform pad pitches and a uniform bump standoff height is shown, in accordance with an embodiment. In FIGS. 5A-5L a set of pads 511-514 are illustrated adjacent to each other for simplicity. However, it is to be appreciated that the different pitched pads 511-514 may be located at any position of the electronic package 560 and need not be adjacent to each other. Furthermore, only the solder resist layer 502 of the electronic package 560 is shown for simplicity. It is to be appreciated that a package substrate and embedded bridges may be positioned below the solder resist layer 502 (similar to the embodiments disclosed above).

Figure 5A:
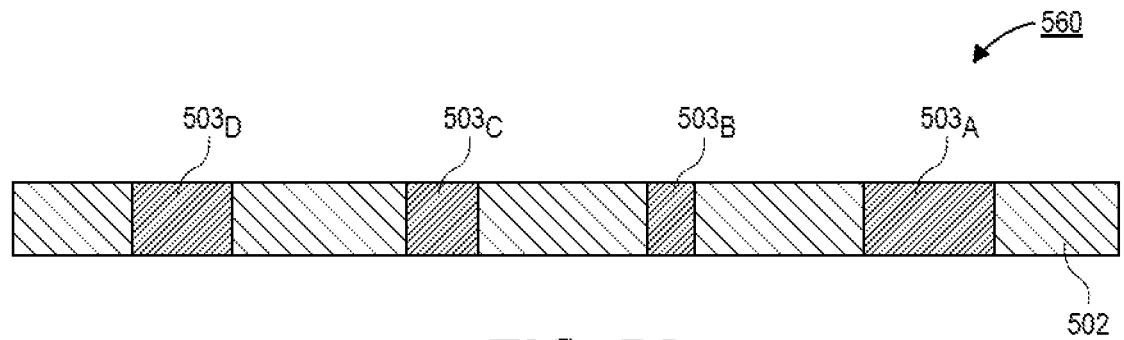
FIGS. 5A-5L are cross-sectional illustrations of a process for providing a uniform FLI bump standoff height in an electronic package with pads that have a non-uniform pitch, in accordance with an embodiment.

Referring now to FIG. 5A, a cross-sectional illustration of an electronic package 560 at a stage of manufacture is shown, in accordance with an embodiment. As shown, pillars $503_{A-D}$ are disposed through a solder resist layer 502. In the illustrated embodiment, the pillars $503_{A-D}$ have non-uniform widths. However, in other embodiments, two or more of the pillars $503_{A-D}$ may have substantially the same width.

Figure 5B:
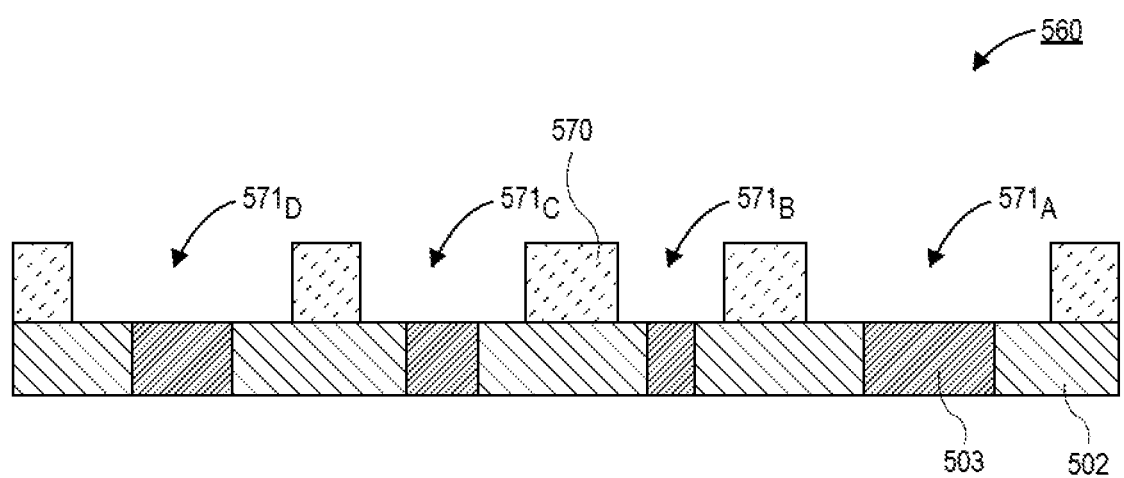

Referring now to FIG. 5B, a cross-sectional illustration of the electronic package 560 after a first resist layer 570 is disposed over the solder resist layer 502 and patterned is shown, in accordance with an embodiment. In an embodiment, the first resist layer 570 may be a dry film resist (DFR). The first resist layer 570 may be patterned to form a plurality of openings $571_{A-D}$. The openings $571_{A-D}$ may each expose one of the underlying pillars 503.

Figure 5C:
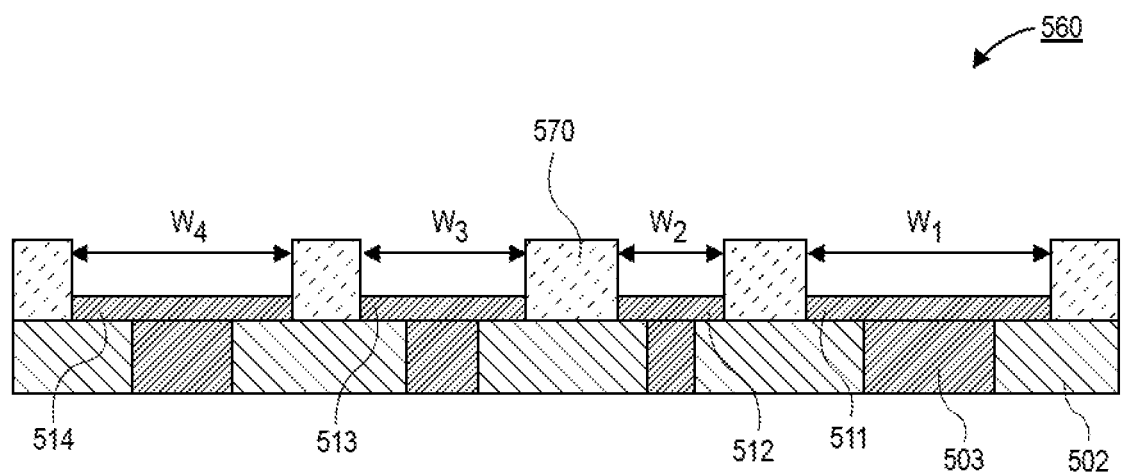

Referring now to FIG. 5C, a cross-sectional illustration of the electronic package 560 after package side pads 511-514 are formed in the openings $571_{A-D}$ is shown, in accordance with an embodiment. A first pad 511 is in opening $571_A$, a second pad 512 is opening $571_B$, a third pad 513 is in opening $571_C$, and a fourth pad 514 is in opening $571_D$. In an embodiment, the pads 511-514 may have a non-uniform width (i.e., widths $W_1$-$W_4$). While only a single one of each pad 511-514 is shown, it is to be appreciated that a plurality of each of the various pads 511-514 may be formed.

Additionally, the pitch of the pads 511-514 may be non-uniform. In an embodiment, the first pads 511 have the largest pitch, the fourth pads 514 have the next largest pitch, the third pads 513 have the next largest pitch, and the second pads 512 have the smallest pitch. In an embodiment, the first pads 511 may have a pitch that is approximately 60 μm or larger, and the second pads may have a pitch that is approximately 40 μm or smaller. In an embodiment, the third pads 513 and the fourth pads 514 may have pitches between approximately 40 μm and approximately 60 μm.

Figure 5D:
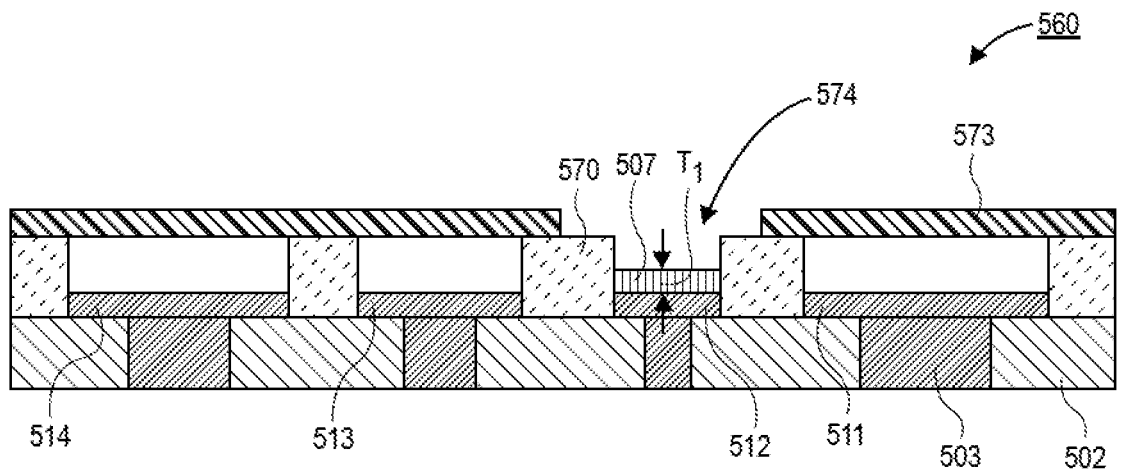

Referring now to FIG. 5D, a cross-sectional illustration of the electronic package 560 after a first barrier layer 507 is formed over the second pad 512 is shown, in accordance with an embodiment. In an embodiment, a second resist layer 573 is disposed over the first resist layer 570 and patterned to form an opening 574 over the second pad 512. In an embodiment, the first resist layer 570 may be an opposite tone resist than the second resist layer 573. For example, the first resist layer 570 may be a negative tone resist and the second resist layer 573 may be a positive tone resist. In the illustrated embodiment, the second resist layer 573 spans across the openings 571 of the first resist layer 570. However, in other embodiments, the second resist layer 573 may fill the openings 571. In an embodiment, the first barrier layer 507 is disposed over the second pad 512. The first barrier layer 507 may have a first thickness $T_1$.

Figure 5E:
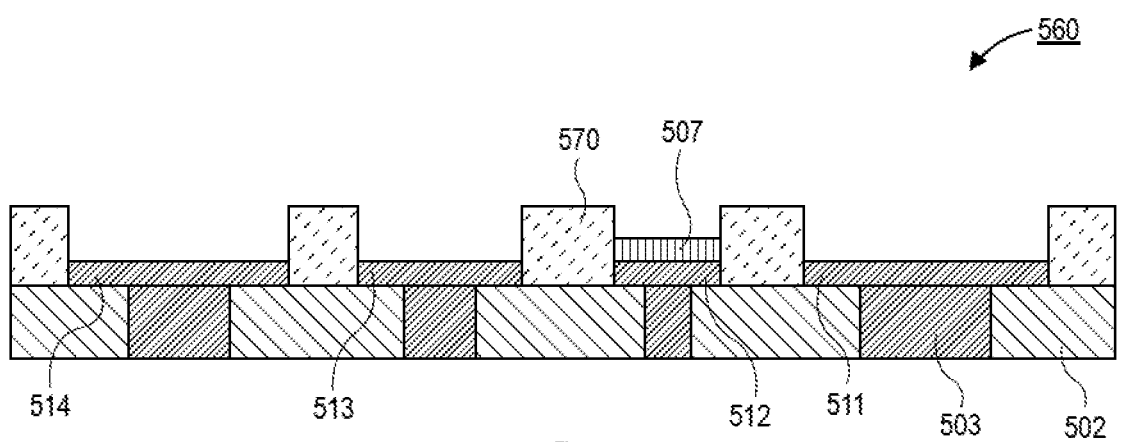

Referring now to FIG. 5E, a cross-sectional illustration of the electronic package 560 after the second resist layer 573 is removed is shown, in accordance with an embodiment. Since the first resist layer 570 and the second resist layer 573 are opposite tone resists, the removal of the second resist layer 573 does not substantially alter the pattern in the first resist layer 570.

Figure 5F:
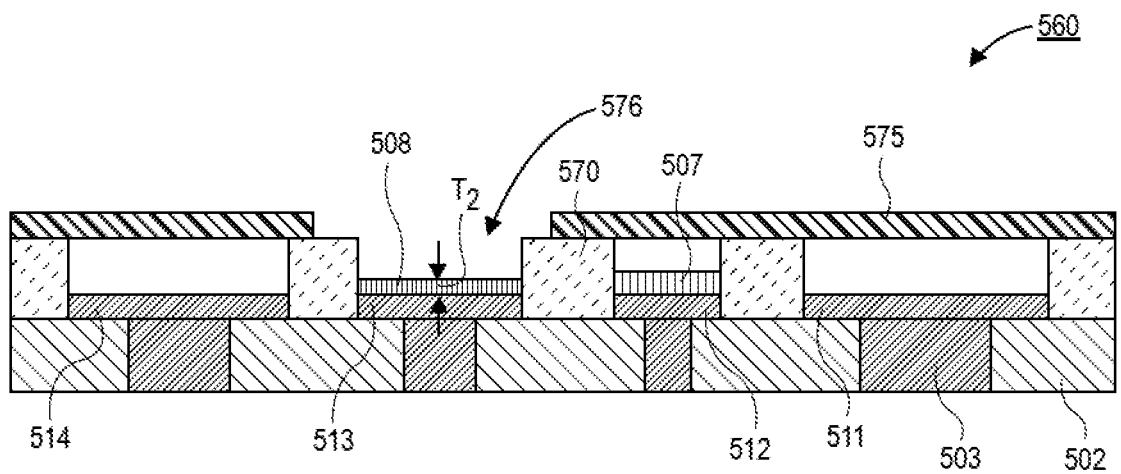

Referring now to FIG. 5F, a cross-sectional illustration of the electronic package 560 after a second barrier layer 508 is formed over the third pad 513 is shown, in accordance with an embodiment. In an embodiment, a third resist layer 575 is disposed over the first resist layer 570 and patterned to form an opening 576 over the third pad 513. In an embodiment, the first resist layer 570 may be an opposite tone resist than the third resist layer 575. For example, the first resist layer 570 may be a negative tone resist and the third resist layer 575 may be a positive tone resist. In the illustrated embodiment, the third resist layer 575 spans across the openings 571 of the first resist layer 570. However, in other embodiments, the third resist layer 575 may fill the openings 571. In an embodiment, the second barrier layer 508 is disposed over the third pad 513. The second barrier layer 508 may have a second thickness $T_2$. In an embodiment, the second thickness $T_2$ is smaller than the first thickness $T_1$.

Figure 5G:
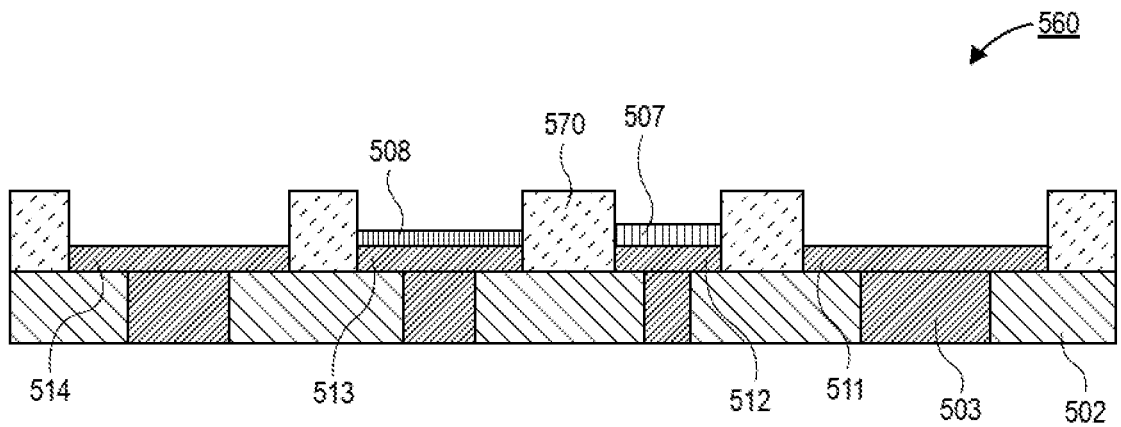

Referring now to FIG. 5G, a cross-sectional illustration of the electronic package 560 after the third resist layer 575 is removed is shown, in accordance with an embodiment. Since the first resist layer 570 and the third resist layer 575 are opposite tone resists, the removal of the third resist layer 575 does not substantially alter the pattern in the first resist layer 570.

Figure 5H:
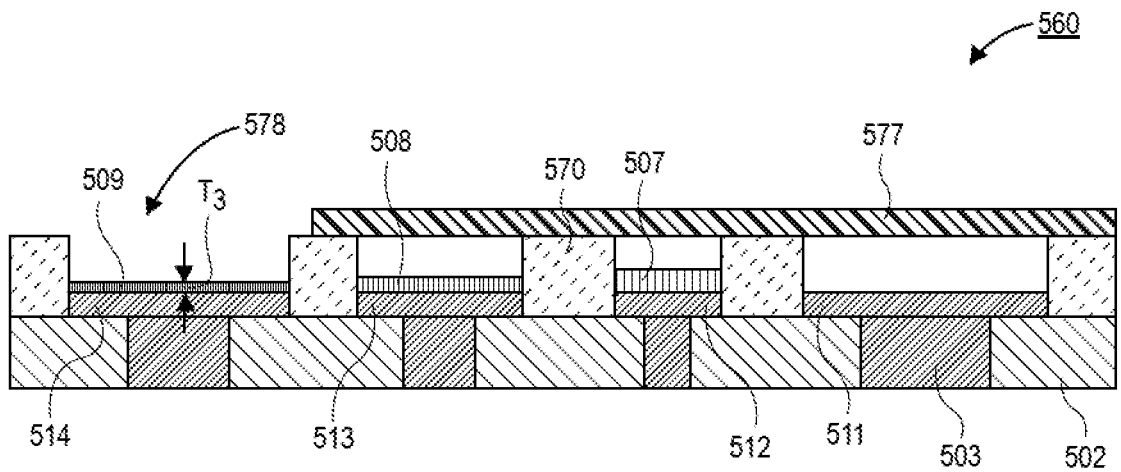

Referring now to FIG. 5H, a cross-sectional illustration of the electronic package 560 after a third barrier layer 509 is formed over the fourth pad 514 is shown, in accordance with an embodiment. In an embodiment, a fourth resist layer 577 is disposed over the first resist layer 570 and patterned to form an opening 578 over the fourth pad 514. In an embodiment, the first resist layer 570 may be an opposite tone resist than the fourth resist layer 577. For example, the first resist layer 570 may be a negative tone resist and the fourth resist layer 577 may be a positive tone resist. In the illustrated embodiment, the fourth resist layer 577 spans across the openings 571 of the first resist layer 570. However, in other embodiments, the fourth resist layer 577 may fill the openings 571. In an embodiment, the third barrier layer 509 is disposed over the fourth pad 514. The third barrier layer 509 may have a third thickness $T_3$. In an embodiment, the third thickness $T_3$ is smaller than the second thickness $T_2$.

Figure 5I:
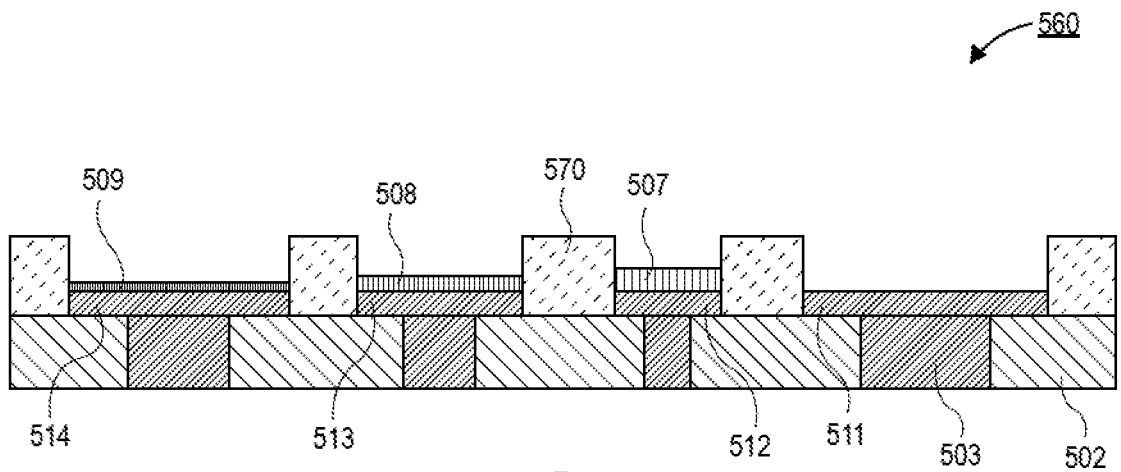

Referring now to FIG. 5I, a cross-sectional illustration of the electronic package 560 after the fourth resist layer 577 is removed is shown, in accordance with an embodiment. Since the first resist layer 570 and the fourth resist layer 577 are opposite tone resists, the removal of the fourth resist layer 577 does not substantially alter the pattern in the first resist layer 570.

In addition to having different thicknesses, the barrier layers 507-509 may also comprise different material compositions. For example, for reliability concerns, different materials (or material stacks) may be needed for the different barrier layers 507-509. However, it is to be appreciated that in other embodiments, two or more of the barrier layers 507-509 may also comprise the same material (or material stacks). Additionally, while there is no barrier layer over the first pad 511, embodiments may also include a barrier layer over the first pad 511. In such embodiments, a thickness of a barrier layer over the first pad 511 would have a thickness smaller than a thickness of the third barrier layer 509.

Figure 5J:
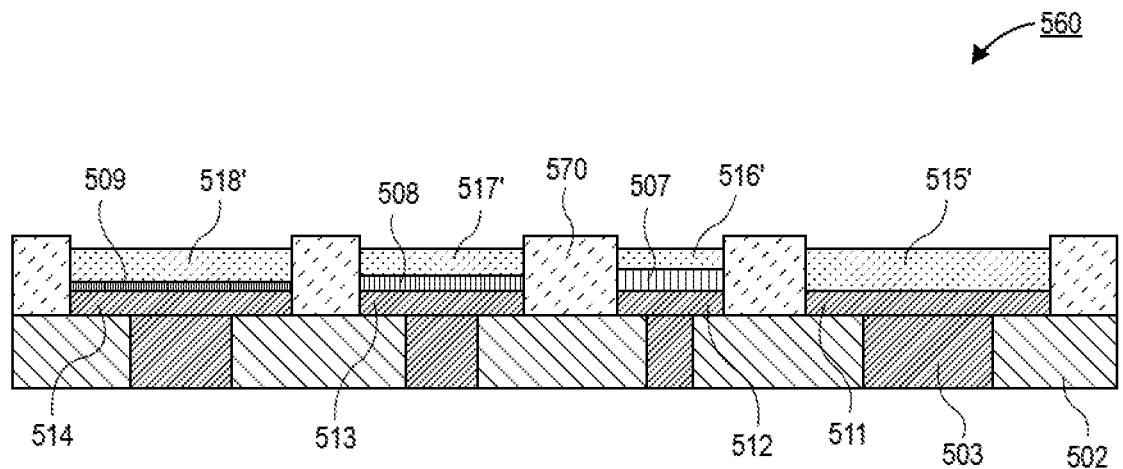

Referring now to FIG. 5J, a cross-sectional illustration of the electronic package 560 after solder is disposed over each of the pads 511-514 is shown, in accordance with an embodiment. As shown the solder 515'-518' is disposed in the openings of the first resist layer 570. While shown as having top surfaces that are substantially coplanar, it is to be appreciated that the un-reflown solder 515'-518' may have non-planar top surfaces as a result of the variable thickness barrier layers 507-509.

Figure 5K:
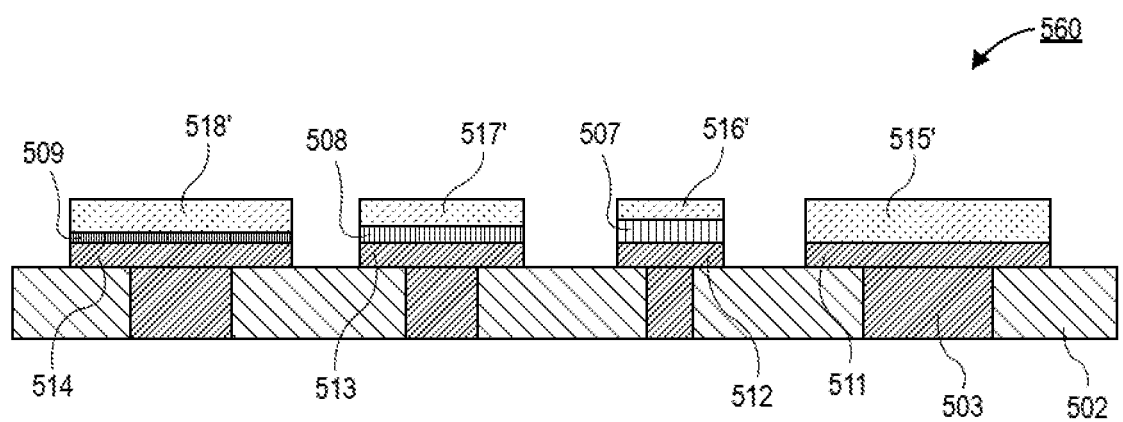

Referring now to FIG. 5K, a cross-sectional illustration of the electronic package 560 after the first resist layer 570 is removed is shown. The first resist layer 570 may be removed with any suitable process.

Figure 5L:
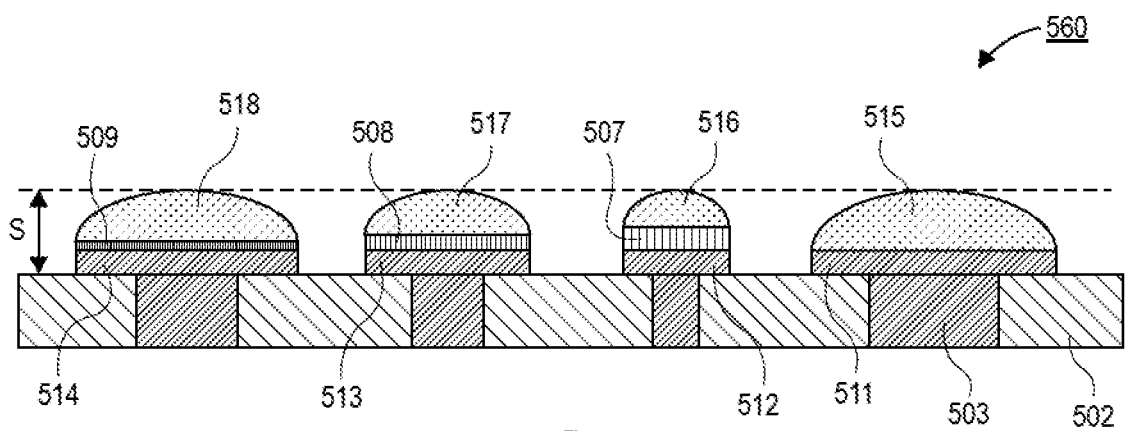

Referring now to FIG. 5L, a cross-sectional illustration of the electronic package 560 after a solder reflow is shown, in accordance with an embodiment. After reflow, the solder bump standoff height S is uniform for each of the solder bumps 515-518. The uniform standoff height S allows for improved TCB performance and improved solder joint reliability.

Figure 6:
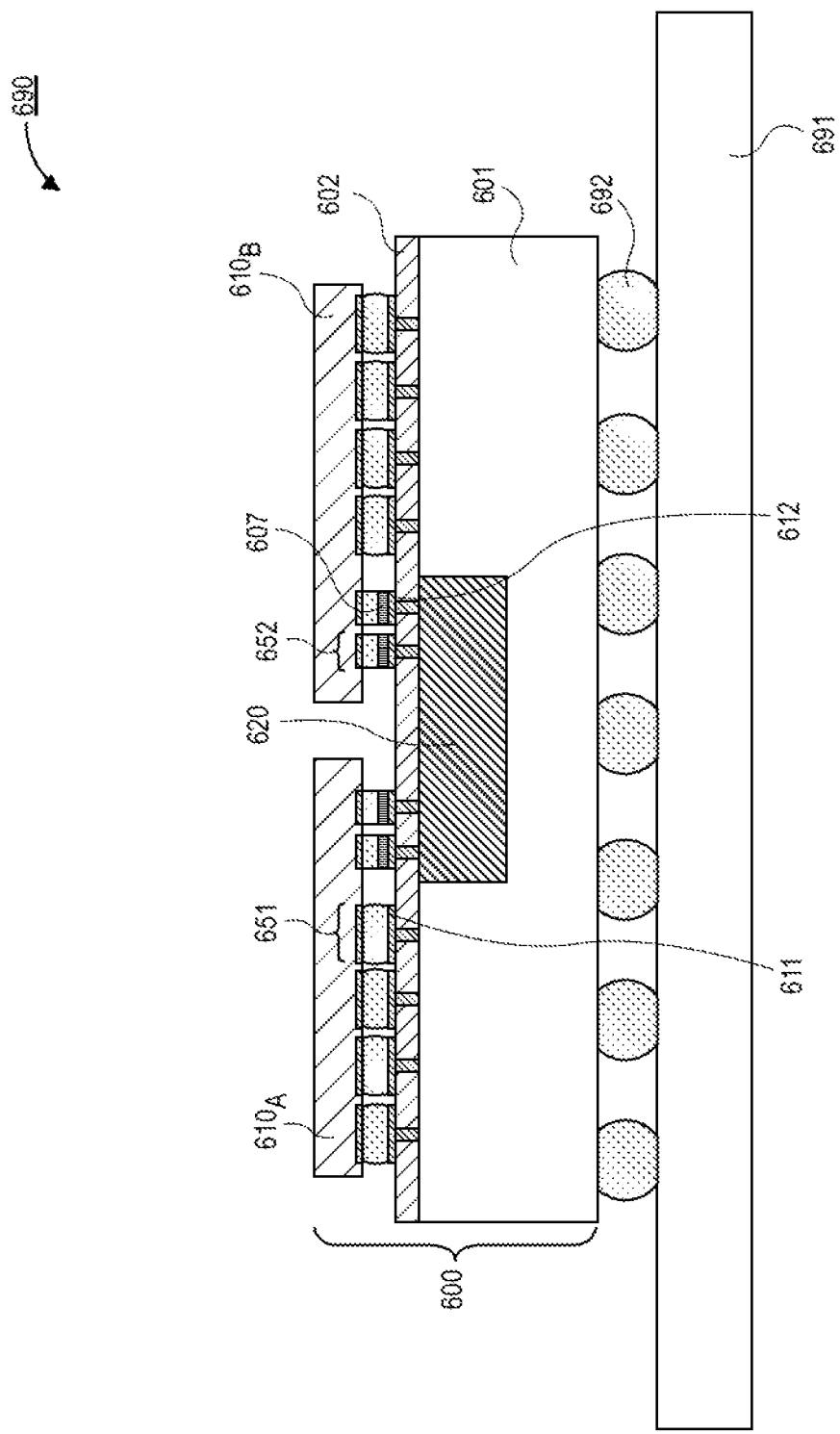
FIG. 6 is a cross-sectional illustration of an electronic system that comprises an electronic package with non-uniform pad pitches, in accordance with an embodiment.

Referring now to FIG. 6, a cross-sectional illustration of an electronic system 690 is shown, in accordance with an embodiment. In an embodiment, the electronic system 690 comprises a board 691 (e.g., a printed circuit board (PCB)). An electronic package 600 is attached to the board 691 by interconnects 692. The interconnects 692 are shown as solder balls, but it is to be appreciated that the interconnects 692 may comprise any architecture (e.g., sockets, wire bonds, etc.).

In an embodiment, the electronic package 600 may be similar to any of the electronic packages disclosed herein. For example, the electronic package 600 in FIG. 6 is substantially similar to the electronic package 200 in FIG. 2B. That is, the electronic package 600 comprises a package substrate 601 with a solder resist layer 602. In an embodiment, a pair of dies $610_A$ and $610_B$ are over the package substrate 601. The dies $610_A$ and $610_B$ may be electrically coupled together by a bridge 620 that is embedded in the package substrate 601. In an embodiment, the electronic package 600 may comprise first interconnects 651 over first pads 611 and second interconnects 652 over second pads 612. The first pads 611 may have a first pitch that is greater than a second pitch of the second interconnects 652. In order to provide a uniform reflown solder standoff height, the second pads 612 may comprise a barrier layer 607 that provides additional Z-height to the reflown solder.

Figure 7:
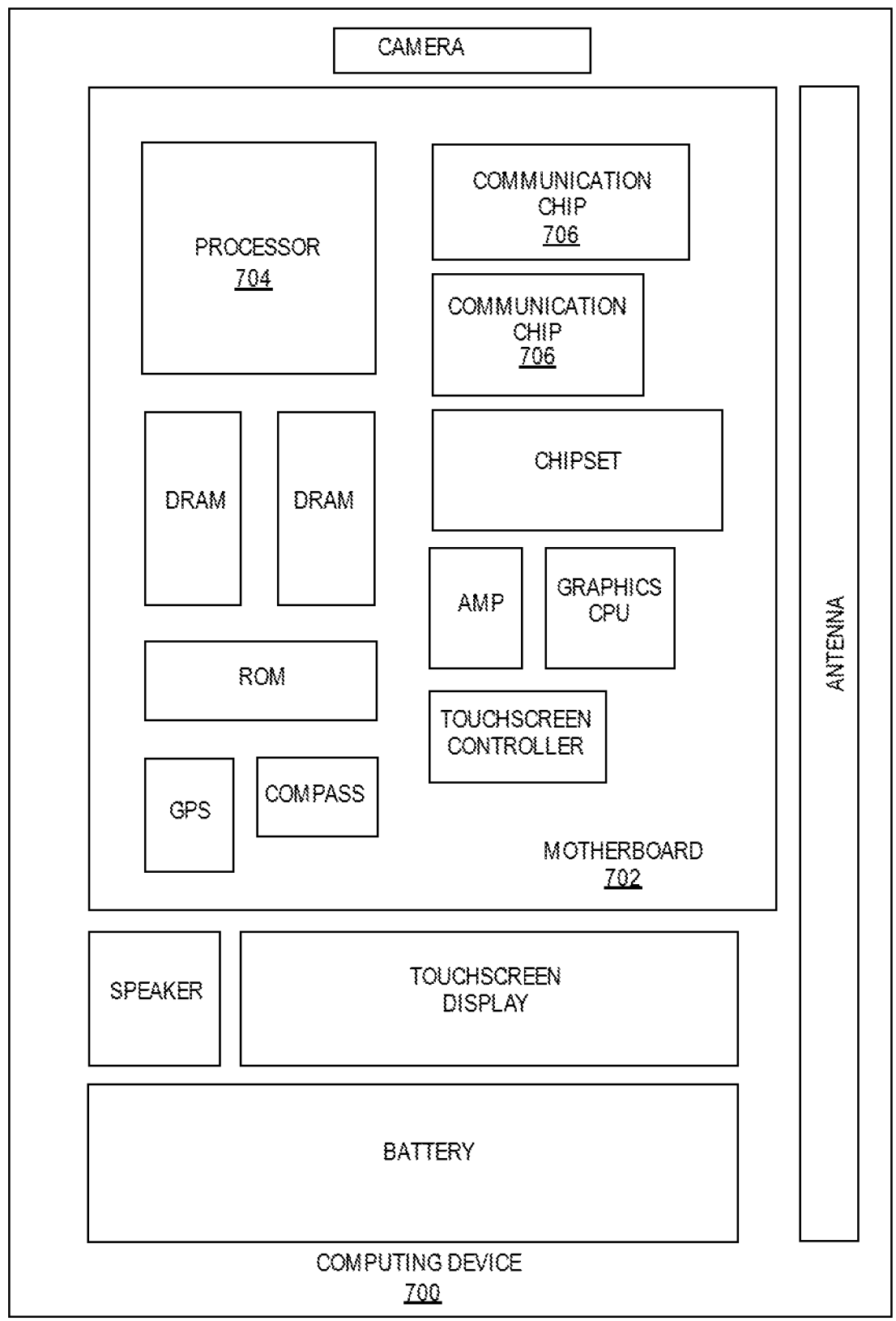
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package comprises non-uniform interconnect pitches and barrier layers with non-uniform thicknesses, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package includes non-uniform interconnect pitches and barrier layers with non-uniform thicknesses, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a bridge substrate embedded in the package substrate; first pads over the package substrate, wherein the first pads have a first pitch; second pads over the bridge substrate, wherein the second pads have a second pitch that is smaller than the first pitch; a barrier layer over individual ones of the second pads; and reflown solder over individual ones of the first pads and over individual ones of the second pads, wherein a first standoff height of the reflown solder over the first pads is equal to a second standoff height of the reflown solder over the second pads.

Example 2: the electronic package of Example 1, wherein the first pitch is greater than 60 μm and the second pitch is 60 μm or less.

Example 3: the electronic package of Example 2, wherein the second pitch is 40 μm or less.

Example 4: the electronic package of Examples 1-3, further comprising a second barrier layer over the first pads.

Example 5: the electronic package of Example 4, wherein the barrier layer comprises a first material composition, and wherein second the barrier layer comprises a second material composition that is different than the first material composition.

Example 6: the electronic package of Example 4, wherein the barrier layer has a first thickness, and wherein the second barrier layer has a second thickness that is smaller than the first thickness.

Example 7: the electronic package of Examples 1-6, further comprising: a second bridge substrate embedded in the package substrate; and third pads over the second bridge substrate, wherein the third pads have a third pitch, and wherein reflown solder is over individual ones of the third pads.

Example 8: the electronic package of Example 7, wherein the third pitch is between the first pitch and the second pitch.

Example 9: the electronic package of Example 8, further comprising: a second barrier layer over individual ones of the third pads, wherein the barrier layer has a first thickness, and wherein the second barrier layer has a second thickness that is less than the first thickness.

Example 10: the electronic package of Example 9, wherein a third standoff height of the reflown solder over the third pads is equal to the first standoff height of the reflown solder over the first pads.

Example 11: the electronic package of Examples 7-10, further comprising: a third bridge substrate embedded in the package substrate; and fourth pads over the third bridge substrate, wherein the fourth pads have a fourth pitch, and wherein reflown solder is over individual ones of the fourth pads.

Example 12: the electronic package of Example 11, wherein the first pitch is greater than 60 μm, wherein the second pitch is smaller than the first pitch, wherein the third pitch is smaller than the second pitch, and wherein the fourth pitch is smaller than the third pitch.

Example 13: the electronic package of Example 12, wherein reflown solder over the third pads has a third standoff height, wherein reflown solder over the fourth pads has a fourth standoff height, and wherein the first standoff height, the second standoff height, the third standoff height, and the fourth standoff height are substantially equal.

Example 14: an electronic package, comprising: a package substrate, wherein first pads are over the package substrate, and wherein the first pads have a first pitch; a bridge substrate embedded in the package substrate, wherein second pads are over the bridge substrate, wherein the second pads have a second pitch that is smaller than the first pitch, and wherein a barrier layer is over the second pads; a first die over to the package substrate, wherein the first die is attached to the first pads by first interconnects, and wherein the first die is attached to the second pads by second interconnects; and a second die over to the package substrate, wherein the second die is attached to the first pads by first interconnects, and wherein the second die is attached to the second pads by second interconnects.

Example 15: the electronic package of Example 14, wherein the first die is electrically coupled to the second die by the bridge substrate.

Example 16: the electronic package of Example 14 or Example 15, further comprising: a second bridge substrate embedded in the package substrate, wherein third pads are over the second bridge substrate, wherein the third pads have a third pitch that is smaller than the first pitch and larger than the second pitch, and wherein a second barrier layer is over the third pads; and a third die over the package substrate, wherein the third die is attached to the first pads by first interconnects, and wherein the third die is attached to third pads by third interconnects.

Example 17: the electronic package of Example 16, wherein the third die is electrically coupled to the first die by the bridge substrate.

Example 18: the electronic package of Example 16 or Example 17, wherein the barrier layer has a first thickness, and wherein the second barrier layer has a second thickness that is smaller than the first thickness.

Example 19: the electronic package of Examples 16-18, wherein the barrier layer is a different material than the second barrier layer.

Example 20: the electronic package of Examples 16-19, wherein the first die and the second die are processors, and wherein the third die is a memory die.

Example 21: the electronic package of Examples 16-20, wherein the first pitch is 60 μm or greater, wherein the second pitch is 40 μm or smaller, and wherein the third pitch is between 60 μm and 40 μm.

Example 22: the electronic package of Examples 16-21, further comprising: a third bridge substrate embedded in the package substrate, wherein fourth pads are over the third bridge substrate, wherein the fourth pads have a fourth pitch that is smaller than the first pitch and larger than the third pitch, and wherein a third barrier layer is over the fourth pads; and a fourth die over the package substrate, wherein the fourth die is attached to the first pads by first interconnects, and wherein the fourth die is attached to fourth pads by fourth interconnects.

Example 23: an electronic system, comprising: a board; an electronic package attached to the board, wherein the electronic package comprises: a package substrate, wherein first pads are over the package substrate, and wherein the first pads have a first pitch; a bridge substrate embedded in the package substrate, wherein second pads are over the bridge substrate, wherein the second pads have a second pitch that is smaller than the first pitch, and wherein a barrier layer is over the second pads; a first die over to the package substrate, wherein the first die is attached to the first pads by first interconnects, and wherein the first die is attached to the second pads by second interconnects; and a second die over to the package substrate, wherein the second die is attached to the first pads by first interconnects, and wherein the second die is attached to the second pads by second interconnects.

Example 24: the electronic system of Example 23, wherein the electronic package further comprises: a second bridge substrate embedded in the package substrate, wherein third pads are over the second bridge substrate, wherein the third pads have a third pitch that is smaller than the first pitch and larger than the second pitch, and wherein a second barrier layer is over the third pads; and a third die over the package substrate, wherein the third die is attached to the first pads by first interconnects, and wherein the third die is attached to third pads by third interconnects.

Example 25: the electronic system of Example 24, wherein the electronic package further comprises: a third bridge substrate embedded in the package substrate, wherein fourth pads are over the third bridge substrate, wherein the fourth pads have a fourth pitch that is smaller than the first pitch and larger than the third pitch, and wherein a third barrier layer is over the fourth pads; and a fourth die over the package substrate, wherein the fourth die is attached to the first pads by first interconnects, and wherein the fourth die is attached to fourth pads by fourth interconnects.

What is claimed is:

1. An electronic package, comprising:
   a package substrate;
   a bridge substrate embedded in the package substrate;
   first pads over the package substrate, wherein the first pads have a first pitch;
   second pads over the bridge substrate, wherein the second pads have a second pitch that is smaller than the first pitch;
   a barrier layer over individual ones of the second pads; and
   a reflown solder over individual ones of the first pads and over individual ones of the second pads, wherein a first standoff height of the reflown solder over the first pads is equal to a second standoff height of the reflown solder over the second pads, and wherein a bottommost surface of the reflown solder over the first pads is below a bottommost surface of the reflown solder over the second pads.

2. The electronic package of claim 1, wherein the first pitch is greater than 60 μm and the second pitch is 60 μm or less.

3. The electronic package of claim 2, wherein the second pitch is 40 μm or less.

4. The electronic package of claim 1, further comprising a second barrier layer over the first pads.

5. The electronic package of claim 4, wherein the barrier layer comprises a first material composition, and wherein the second barrier layer comprises a second material composition that is different than the first material composition.

6. The electronic package of claim 4, wherein the barrier layer has a first thickness, and wherein the second barrier layer has a second thickness that is smaller than the first thickness.

7. The electronic package of claim 1, further comprising:
   a second bridge substrate embedded in the package substrate; and
   third pads over the second bridge substrate, wherein the third pads have a third pitch, and wherein the reflown solder is over individual ones of the third pads.

8. The electronic package of claim 7, wherein the third pitch is between the first pitch and the second pitch.

9. The electronic package of claim 8, further comprising:
   a second barrier layer over individual ones of the third pads, wherein the barrier layer has a first thickness, and wherein the second barrier layer has a second thickness that is less than the first thickness.

10. The electronic package of claim 9, wherein a third standoff height of the reflown solder over the third pads is equal to the first standoff height of the reflown solder over the first pads.

11. The electronic package of claim 7, further comprising:
    a third bridge substrate embedded in the package substrate; and
    fourth pads over the third bridge substrate, wherein the fourth pads have a fourth pitch, and wherein the reflown solder is over individual ones of the fourth pads.

12. The electronic package of claim 11, wherein the first pitch is greater than 60 μm, wherein the second pitch is smaller than the first pitch, wherein the third pitch is smaller than the second pitch, and wherein the fourth pitch is smaller than the third pitch.

13. The electronic package of claim 12, wherein reflown solder over the third pads has a third standoff height, wherein the reflown solder over the fourth pads has a fourth standoff height, and wherein the first standoff height, the second standoff height, the third standoff height, and the fourth standoff height are substantially equal.

14. An electronic package, comprising:
    a package substrate, wherein first pads are over the package substrate, and wherein the first pads have a first pitch;
    a bridge substrate embedded in the package substrate, wherein second pads are over the bridge substrate, wherein the second pads have a second pitch that is smaller than the first pitch, and wherein a barrier layer is over the second pads;
    a first die over to the package substrate, wherein the first die is attached to the first pads by first interconnects, and wherein the first die is attached to the second pads by second interconnects; and
    a second die over to the package substrate, wherein the second die is attached to the first pads by the first interconnects, wherein the second die is attached to the second pads by the second interconnects, and wherein the first interconnects and the second interconnects comprises a reflown solder, the reflown solder having a bottommost surface over the first pads that is below a bottommost surface of the reflown solder over the second pads.

15. The electronic package of claim 14, wherein the first die is electrically coupled to the second die by the bridge substrate.

16. The electronic package of claim 14, further comprising:
    a second bridge substrate embedded in the package substrate, wherein third pads are over the second bridge substrate, wherein the third pads have a third pitch that is smaller than the first pitch and larger than the second pitch, and wherein a second barrier layer is over the third pads; and a third die over the package substrate, wherein the third die is attached to the first pads by first interconnects, and wherein the third die is attached to the third pads by third interconnects.

17. The electronic package of claim 16, wherein the third die is electrically coupled to the first die by the bridge substrate.

18. The electronic package of claim 16, wherein the barrier layer has a first thickness, and wherein the second barrier layer has a second thickness that is smaller than the first thickness.

19. The electronic package of claim 16, wherein the barrier layer is a different material than the second barrier layer.

20. The electronic package of claim 16, wherein the first die and the second die are processors, and wherein the third die is a memory die.

21. The electronic package of claim 16, wherein the first pitch is 60 μm or greater, wherein the second pitch is 40 μm or smaller, and wherein the third pitch is between 40 μm and 60 μm.

22. The electronic package of claim 16, further comprising:
   a third bridge substrate embedded in the package substrate, wherein fourth pads are over the third bridge substrate, wherein the fourth pads have a fourth pitch that is smaller than the first pitch and larger than the third pitch, and wherein a third barrier layer is over the fourth pads; and
   a fourth die over the package substrate, wherein the fourth die is attached to the first pads by the first interconnects, and wherein the fourth die is attached to the fourth pads by fourth interconnects.

23. An electronic system, comprising:
   a board;
   an electronic package attached to the board, wherein the electronic package comprises:
      a package substrate, wherein first pads are over the package substrate, and wherein the first pads have a first pitch;
      a bridge substrate embedded in the package substrate, wherein second pads are over the bridge substrate, wherein the second pads have a second pitch that is smaller than the first pitch, and wherein a barrier layer is over the second pads;
      a first die over to the package substrate, wherein the first die is attached to the first pads by first interconnects, and wherein the first die is attached to the second pads by second interconnects; and
      a second die over to the package substrate, wherein the second die is attached to the first pads by the first interconnects, and wherein the second die is attached to the second pads by the second interconnects, and wherein the first interconnects and the second interconnects comprises a reflown solder, the reflown solder having a bottommost surface over the first pads that is below a bottommost surface of the reflown solder over the second pads.

24. The electronic system of claim 23, wherein the electronic package further comprises:
   a second bridge substrate embedded in the package substrate, wherein third pads are over the second bridge substrate, wherein the third pads have a third pitch that is smaller than the first pitch and larger than the second pitch, and wherein a second barrier layer is over the third pads; and
   a third die over the package substrate, wherein the third die is attached to the first pads by the first interconnects, and wherein the third die is attached to the third pads by third interconnects.

25. The electronic system of claim 24, wherein the electronic package further comprises:
   a third bridge substrate embedded in the package substrate, wherein fourth pads are over the third bridge substrate, wherein the fourth pads have a fourth pitch that is smaller than the first pitch and larger than the third pitch, and wherein a third barrier layer is over the fourth pads; and
   a fourth die over the package substrate, wherein the fourth die is attached to the first pads by the first interconnects, and wherein the fourth die is attached to the fourth pads by fourth interconnects.

* * * * *